Nov. 2, 1965 | O D PARHAM | 3,215,863

ASYNCHRONOUS COMPUTER GATING DEVICE

Filed Nov. 7, 1963 | 3 Sheets-Sheet 1

INVENTOR.
O D PARHAM,
BY Robert H. Himes
ATTORNEY.

ASYNCHRONOUS COMPUTER GATING DEVICE

Filed Nov. 7, 1963 3 Sheets-Sheet 2

INVENTOR.
O D PARHAM,
BY Robert H. Hines
ATTORNEY.

Nov. 2, 1965 O D PARHAM 3,215,863

ASYNCHRONOUS COMPUTER GATING DEVICE

Filed Nov. 7, 1963 3 Sheets-Sheet 3

CHARACTERISTICS OF DIODE HAVING "STORAGE" OR "REVERSE-RECOVERY" CHARACTERISTICS

INVENTOR.
OD PARHAM,
BY
Robert H. Hines
ATTORNEY.

3,215,863
Patented Nov. 2, 1965

3,215,863

ASYNCHRONOUS COMPUTER GATING DEVICE

O D Parham, Downey, Calif., assignor to Hughes Aircraft Company, Culver City, Calif., a corporation of Delaware Filed Nov. 7, 1963, Ser. No. 322,123
6 Claims. (Cl. 307—88.5)

This invention relates generally to an electronic switching device for digital computers and, more particularly, to a high-speed gating apparatus which operates independently of clock pulses.

In many switching applications, deterioration and attenuation are experienced in the passing of the signal through the switching element, only limited numbers of input signals can be switched and isolation between input and output is often unsatisfactory.

It is a general object of the present invention to provide an improved asynchronous gating device.

Another object of the invention is to provide a gating device having substantial isolation between input and output.

Still another object of the invention is to provide a gating device incorporating tunnel diodes in a manner to achieve greater "fan-in" and "fan-out" capability.

A further object of the invention is to provide a gating device capable of generating a square wave pulse output during high speed operation.

In accordance with the present invention, a resistor, a first tunnel diode and a second tunnel diode are connected in the order named from a voltage source to a junction maintained at a substantially fixed reference potential level. The first and second tunnel diodes are characterized in that the "peak" current of the first tunnel diode is less than the "peak" current and greater than the "valley" current of the second tunnel diode. An input gating network is connected to the junction between the resistor and first tunnel diode, and output terminals together with a backward diode serially connected with a delay line are connected across the second tunnel diode.

In operation, the first and second tunnel diodes have quiescent conditions corresponding to switched and non-switched states, respectively, the second tunnel diode being maintained in the switched state by means of a voltage applied through the delay line and backward diode. A change in the potential level at the output of the input gating network effects a change in the state of the first tunnel diode to the switched state which, in turn, causes the second tunnel diode to revert to the non-switched state. This change generates a shift in potential that constitutes the initial negative excursion of an output pulse which, in turn, is sensed by the backward diode and delay line and reflected in a manner to reverse the respective states of the tunnel diodes back to the quiescent states within a period of time determined by the delay line.

The above-mentioned and other features and objects of this invention and the manner of obtaining them will become more apparent by reference to the following description taken in conjunction with the accompanying drawings, wherein.

Figure 1:
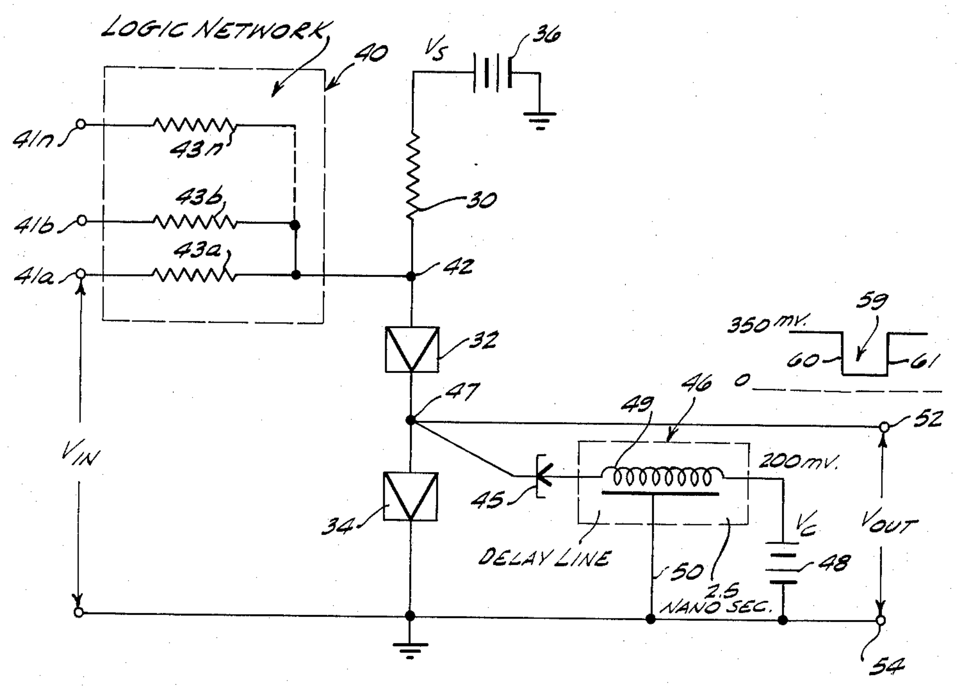
FIG. 1 shows a schematic circuit diagram of a preferred embodiment of the invention.

In the following description of the present invention, reference is made to tunnel and backward diodes. Referring to FIGS. 2 and 3 of the drawings, there is illustrated current-voltage characteristics of tunnel and backward diodes, respectively, together with the manner in which they are designated in FIG. 1 of the drawings. Referring now to FIG. 2, there is illustrated a typical current vs. voltage characteristic 10 of a tunnel diode wherein current flow is indicated along the abscissa and voltage-drop across the diode is indicated along the ordinate.

In addition, a symbol 11 is employed to designate a tunnel diode. Symbol 11 constitutes a square 12 enclosing a V 13 which extends from one side of the square 12 to the mid-point of the opposite side thereof. Cathode lead 14 connects to the vertex of the V 13 and an anode lead 15 connects to the mid-point of the side of the square 12 opposite the vertex of the V 13. Normal current flow through the tunnel diode 11 is considered to be from anode 15 to cathode 14 and is represented by positive values of current flow of the characteristic 10. Current flow through a tunnel diode in a backward direction is considered to be current flow from the cathode 14 to the anode 15. Under these circumstances the cathode 14 is necessarily positive relative to the anode 15. Current flow of this type is represented by the negative values of current flow of the characteristic 10. In particular, current flow in a normal direction through a tunnel diode increases in proportion to the voltage drop thereacross until a peak current $I_p$ is reached. The voltage drop across the tunnel diode corresponding to the peak current $I_p$ is referred to as the peak voltage $V_p$. After the peak current $I_p$ is reached, the voltage drop continues to increase with a decrease in current until a null is reached designated by point 17 on the characteristic 10. This null at point 17 is generally referred to as the "Valley voltage," $V_v$, of the tunnel diode and occurs, for example, at a voltage of the order of 350 millivolts. Increases in voltage across a tunnel diode in excess of the valley voltage again produce an increase in current flow. Operation of a tunnel diode at voltage drops thereacross that are less than $V_p$ is designated as operation in the "non-switched" mode, and operation at higher voltage drops is designated as operation in the "switched" mode. Further, increasing the voltage across a tunnel diode to exceed $V_p$ is designated as "setting" the tunnel diode, i.e., changing the mode of operation from the non-switched to the switched mode. With regard to current flow through a tunnel diode in a backward direction, current flow in general increases in proportion to the voltage drop thereacross with a current flow equal to twice the peak current $I_p$ of the tunnel diode corresponding generally to a voltage drop thereacross equal to 0.1 the valley voltage $V_v$ of the tunnel diode. For the purposes of the present invention, any device having a current-voltage characteristic 10 is considered to be the equivalent of a tunnel diode and, as such, is within the scope of the teachings of this specification.

Referring now to FIG. 3 of the drawings, symbol 20 is employed to designate a backward diode and constitutes a short transverse bracket disposed across a lead together with a V having the vertex thereof at the intersection inside the bracket. Normal current flow through a backward diode is considered to be in the direction indicated by the V (when considered as an arrow) and is represented by the portion of a characteristic 22 which corresponds to positive current flow. Backward current flow through a backward diode constitutes current flow therethrough in the opposite direction and corresponds to the portions of characteristic 22 where the current flow is negative. In general, when the current flow through the backward diode is in the normal direction, the potential drop thereacross increases proportionately to the current flow therethrough as illustrated by the upper portion characteristic 22, as viewed in the drawing. In the backward direction, however, there is a slight negative current in regions where the backward voltage drop thereacross is small. This current, however, decreases to zero and remains at zero until voltage drops of the order of 0.4 volt are reached. After this point, current flow rapidly increases with a maximum voltage drop thereacross of the order of 0.5 volt. For this reason, maximum backward voltage normally used across a backward diode have a characteristic of the same type as characteristic 22 is generally of the order of 0.3 volt.

Figures 2, 3:
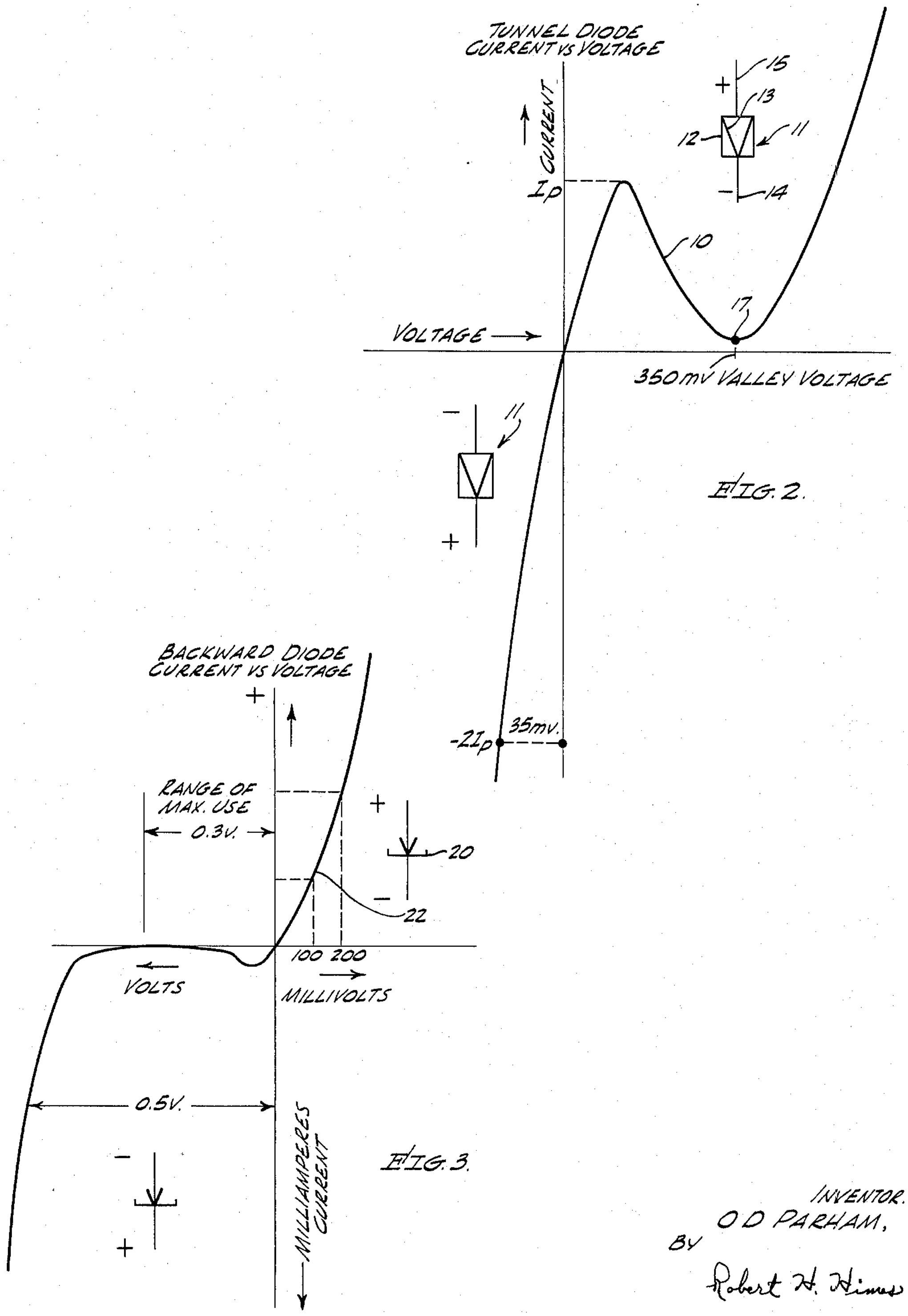
FIGS. 2 and 3 illustrate typical current-voltage characteristics of tunnel and backward diodes, respectively, of the type employed in the apparatus of FIG. 1.

Referring now to FIG. 1 of the drawings, there is shown a preferred embodiment of the asynchronous computer gating device of the present invention. In particular, a resistor 30, a tunnel diode 32 and a tunnel diode 34 are serially connected in the order named from the positive terminal of a battery 36 to ground, the negative terminal of the battery 36 being referenced to ground. The tunnel diodes 32, 34 are both poled to allow current flow therethrough in a normal direction from battery 36 to ground. In accordance with the invention, the tunnel diodes have peak currents of 2 and 5 milliamperes, respectively; the resistor 30 has an ohmic value of the order of 150 ohms; and the voltage $V_s$ generated by the battery 36 is of the order of 500 millivolts.

An input is provided by means of a logic network 40 that has inputs connected from input terminals 41*a*, 41*b* . . . 41*n* to an output terminal connected to a junction 42 between resistor 30 and tunnel diode 32. Logic network 40 may be of any conventional type with the prerequisite that the output voltage appearing at junction 42 change in either a positive or negative direction to indicate a desired combination of input voltages applied to input terminals 41*a*, 41*b* . . . 41*n*. As illustrated, logic network 40 constitutes an "or" gate with resistors 43*a*, 43*b* . . . 43*n*, each of 500 ohms resistance, connected, respectively, from input terminals 41*a*, 41*b* . . . 41*n* to the junction 42.

Further, a backward diode 45 and a delay line 46 are serially connected in the order named from a junction 47 intermediate the tunnel diodes 32, 34 to the positive terminal of a battery 48, the negative terminal of which is referenced to ground. In the present embodiment, the battery 48 provides a voltage $V_c$ of the order of 200 millivolts and the backward diode 45 is poled in a manner to allow normal current flow therethrough in a direction towards the junction 47. The delay line 46 includes an inductive coil 49 interconnecting the backward diode 45 and the positive terminal of battery 48, the respective turns of the inductive coil 49 being capacitively coupled to a lead 50 which, in turn, is referenced to ground. The delay line 46 provides a delay of 2.5 nanoseconds which determines the minimum width of the output pulses which in the present embodiment are of the order of 5 nanoseconds. Lastly, the junction 47 is connected to an output terminal 52 which, together with a terminal 54 that is referenced to ground, constitute output terminals 52, 54 from the asynchronous gating device of the present invention.

In the operation of the asynchronous gating device of the present invention, the voltage $V_c$ generated by battery 48 determines the quiescent state of the tunnel diodes 32, 34. In particular, the battery 48 applies voltage of are order of 200 millivolts through the delay line 46, backward diode 45, across the tunnel diode 34. This potential of the order of 200 millivolts causes the current flowing through tunnel diode 34 to exceed the peak current $I_p$ thereof, thereby causing tunnel diode 34 to switch to the switched state. Upon simultaneous application of potential from battery 36 through resistor 30 and tunnel diodes 32, 34, the potential drop across tunnel diode 34 will approach that of its valley voltage while the potential drop across tunnel diode 32 will be less than the voltage corresponding to the peak voltage thereof. As previously specified, the valley current of tunnel diode 34 is less than the peak current of tunnel diode 32 whereby current flow through tunnel diode 32 in the non-switched state is sufficient to provide the current flow through tunnel diode 34 in the switched state. In addition, the increase in potential drop across tunnel diode 34 resulting from the battery 36 isolates the junction 47 from the potential of battery 48 because of the unidirectional characteristics of backward diode 45. Thus, during quiescent conditions the potential existing at the output terminal 52 is of the order of 350 millivolts.

One mode of operation occurs upon application of one or more positive signals increasing from 0 to 350 millivolts to input terminals 41*a*, 41*b* . . . 41*n* of logic network 40, whereby a positive voltage excursion is developed at junction 42 thereby increasing the voltage across tunnel diode 32. This increase in voltage across tunnel diode 32 switches the tunnel diode 32 to the switched state thereby causing the potential level of junction 47 between the tunnel diodes 32, 34 to decrease below the potential $V_c$. This decrease in negative potential constitutes the initial negative excursion 60 of a negative output pulse 59. In that backward diode 45 is now no longer backbiased, the negative pulse flows through backward diode 45 and delay line 46 where it reverses its potential and is reflected from battery 48. This reflected potential is now positive relative to potential $V_c$ of battery 48. The reflected potential propagates backwards through the delay line 46 and backward diode 45 to apply a positive potential to junction 47 thereby to cause the tunnel diode 34 to again revert to the switched state at a time equal to twice the delay provided by delay line 46. The reversion of tunnel diode 34 to the switched state causes the potential of junction 47, and hence the potential of output terminal 52, to increase as indicated by the positive excursion 61 of waveform 59, FIG. 1. The width of waveform 59, as previously specified, is twice the delay of the delay line 46. Thus, as in the present case, if the delay of delay line 46 is 2.5 nanoseconds, the width of the output pulse 59 is 5 nanoseconds.

In an alternate mode of operation, the input signals applied to the input terminals 41*a*, 41*b* . . . 41*n* decrease from 350 millivolts to 0. The decrease in potential at one or more of the input terminals 41*a*, 41*b* . . . 41*n* decreases the potential at junction 42 thus diverting a portion of the current flowing from battery 36 through resistor 30. This diversion of current decreases the current flow through tunnel diode 34 to a current less than the current corresponding to its valley voltage thereby causing tunnel diode 34 to switch to the non-switched state. The reversion of tunnel diode 34 to the non-switched state, in turn, increases the potential across tunnel diode 32 causing it to change to the switched state thereby achieving a change in the respective states of tunnel diodes 32, 34 in the same manner as before which produces an output pulse having a waveform 59 at the output terminals 52, 54.

If the signals applied to the input terminals 41*a*, 41*b* . . . 41*n* are not concurrent, it is possible to generate more than one resulting waveform 59 at the output terminals 52, 54. In instances where this feature is considered undesirable, it can be avoided by employing the logic networks 40′ 40″ of FIGS. 4 and 5, respectively. The logic networks 40′, 40″ employ a diode having storage or reverse-recovery characteristics illustrated in FIG. 6. In general, a storage-type diode is characterized in that if a small current is allowed to flow therethrough in the forward direction for a predetermined period of time before voltage is reversed across the diode, e.g., for a period of the order of 5 nanoseconds in the case of diodes designated commercially as FD-300 or FD-600, the diode stores energy as indicated by the shaded area 60, FIG. 6. At the instant the potential across the storage diode is reversed, this energy is released in the form of a pulse of polarity opposite to the current flow in the forward direction through the diode. The energy of this pulse, indicated by shaded area 62, FIG. 6, is the same as that represented by shaded area 60 stored in the diode before the potential was reversed thereacross with the exception that it is released in a much shorter period of time than required for storage purposes. The logic networks 40′ 40″ exploit this storage characteristic to isolate the logic networks 40′, 40″ from tunnel diodes 32, 34 until such time as the possibility of occurrence of delayed logic signals is passed.

Figure 4:
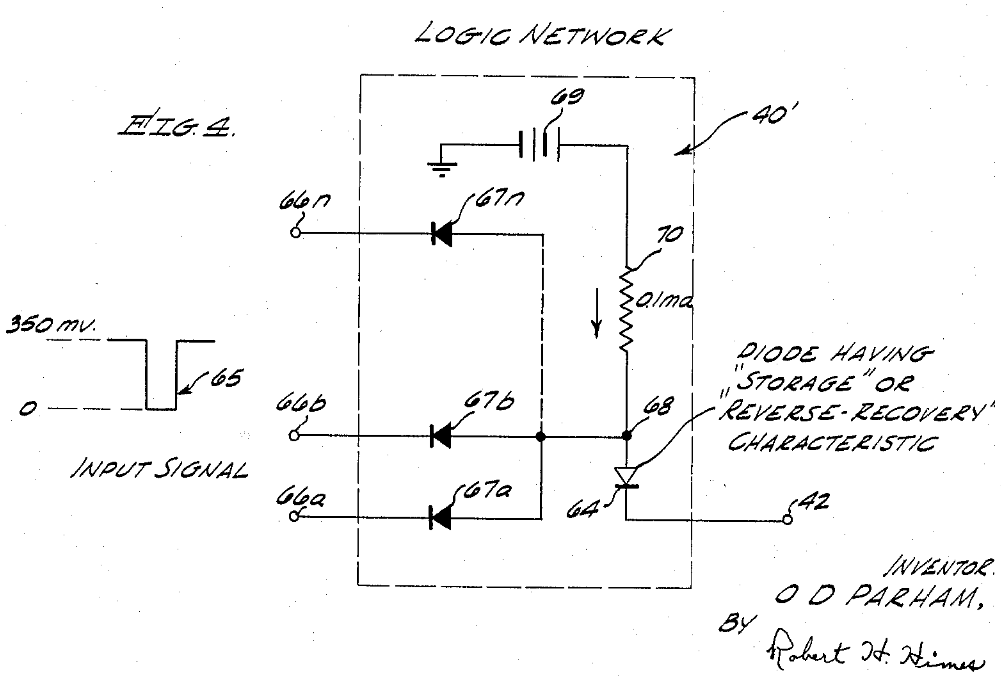
FIGS. 4 and 5 show alternate embodiments of the logic network in the device of FIG. 1 that are specifically adapted to operate in combination therewith.

Referring to FIG. 4, there is shown a schematic circuit diagram of logic network 40′, wherein the stored energy of a diode 64 having storage or reverse-recovery characteristics is utilized to generate a negative pulse at the junction 42 in response to one or more input signals of waveform 65 applied to input terminals *66a*, *66b* . . . *66n*. In particular, logic network 40′ includes silicon diodes *67a*, *67b* . . . *67n* connected, respectively, from input terminals *66a*, *66b* . . . *66n* to a common junction 68, the diodes *67a*, *67b* . . . *67n* being poled to allow normal current flow away from the junction 68. In addition, a battery 69 providing a potential of the order of 5 volts has a negative terminal referenced to ground and a positive terminal connected through a resistor 70 to the junction 68. Junction 68 is, in turn, connected through the storage diode 64 to the junction 42, FIG. 1, the diode 64 being poled to allow normal current flow toward the junction 42. The resistance of resistor 70 is of sufficient magnitude to allow a constant current of the order of 0.1 milliamperes to flow towards the junction 68. In operation, the waveform 65, having a quiescent amplitude of 350 millivolts and a negative excursion to 0 volts, is applied to one or more of the input terminals *66a*, *66b* . . . *66n*. The reduction of voltage across any one of the diodes *67a*, *67b* . . . *67n* to 0 decreases the potential of junction 68 thereby reversing the voltage across storage diode 64. The reversal of voltage across storage diode 64 releases the energy indicated by shaded area 62, FIG. 6, in the form of a negative pulse thereby switching the tunnel diodes 32, 34 in the same manner as previously described. The remainder of the operation is the same as previously described in connection with FIG. 1 with the exception that no additional signals can be applied to the junction 42 through the logic network 40′ until the 0.1 milliampere current flowing through resistor 70 has had sufficient time to store energy in quantities indicated by shaded area 60, FIG. 6, in the storage diode 64.

Figure 5:
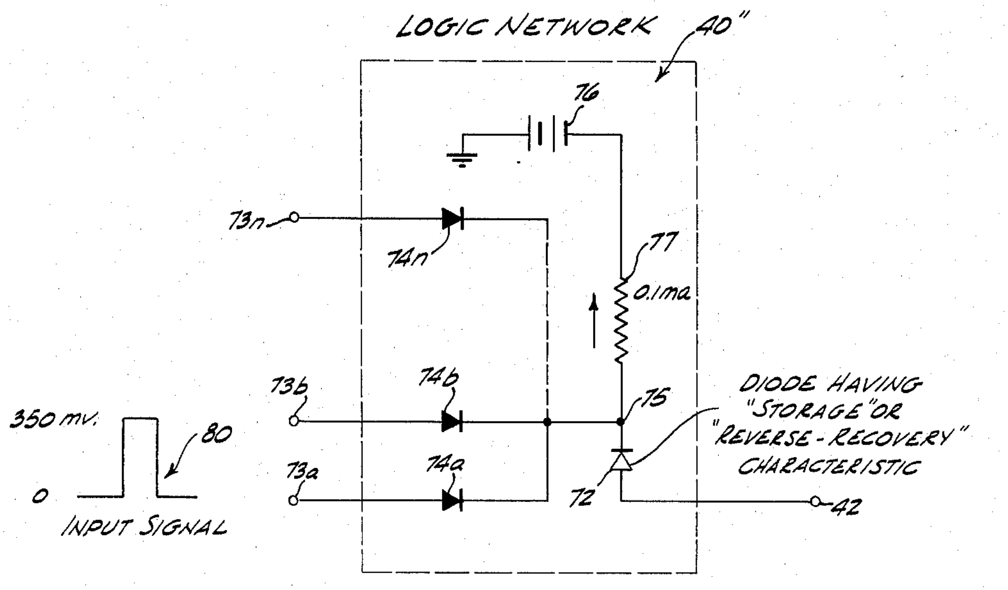
Figure 6:
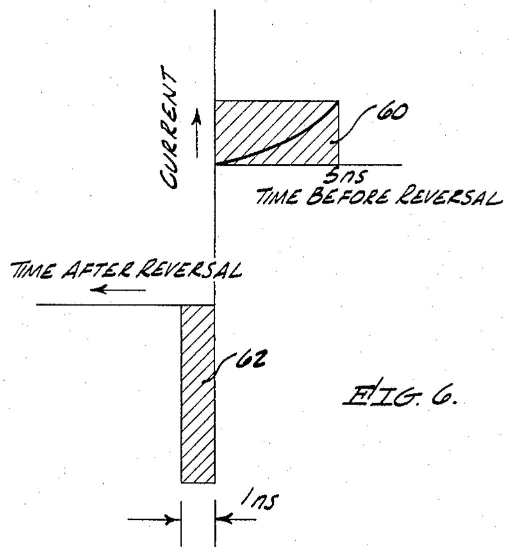
FIG. 6 illustrates characteristics of a diode having storage or reverse-recovery characteristics of the type employed in the logic networks of FIGS. 4 and 5.

Referring to FIG. 5, there is shown a schematic circuit diagram of logic network 40″ wherein a storage diode 72 is employed to generate a positive pulse at the junction 42. Logic network 40″ includes input terminals *73a*, *73b* . . . *73n* connected, respectively, through silicon diodes *74a* *74b* . . . *74n* to a common junction 75, the silicon diodes *74a*, *74b* . . . *74n* being poled to allow normal current flow toward the junction 75. In addition, logic network 40″ includes a battery 76 having the positive terminal thereof referenced to ground and a negative terminal thereof connected through a resistor 77 to the junction 75. The resistance of resistor 77 is sufficient to cause a constant current of 0.1 milliampere to flow therethrough from the junction 75. The storage diode 72 is connected from the junction 42 to the junction 75 and is poled to allow normal current flow towards the junction 75. In operation, the constant current flow towards the junction 75. In operation, the constant current flow of 0.1 milliampere through resistor 77 stores energy designated by shaded area 60, FIG. 6, in the storage diode 72. An input signal of waveform 80 having a quiescent level of 0 volt and a positive excursion to 350 millivolts is applied to one or more of the input terminals *73a*, *73b* . . . *73n*. This positive voltage is applied through the corresponding silicon diode *74a*, *74b* or *74n* to the junction 75 thereby stopping the flow of current through the storage diode 72. This reversal of voltage across the storage diode 72 releases the stored energy in a form designated by shaded area 62, FIG. 6, i.e., releases the energy in the form of a negative pulse, which pulse is applied to junction 42, FIG. 1. The remainder of the operation is the same as described in connection with the gating device of FIG. 1 with the exception that no additional input signals of waveform 80 appearing at input terminals *73a*, *73b* . . . *73n* can develop an output pulse at the output of logic network 40″ until the storage diode 72 has had sufficient time to store energy designated by shaded area 60, FIG. 6.

Although the invention has been shown in connection with a certain specific embodiment, it will be readily apparent to those skilled in the art that various changes in form and arrangement of parts may be made to suit requirements without departing from the spirit and scope of the invention.

What is claimed is:

1. A computer gating device comprising first and second tunnel diodes serially connected in the order named from a first junction to an output junction and from said output junction to a second junction, said second junction being maintained at a substantially fixed reference potential level, said first and second tunnel diodes being poled to allow normal current flow in a predetermined direction therethrough from said first to said second junctions and the peak current of said first tunnel diode being greater than the valley current and less than the peak current of said second tunnel diode; means including a resistor connected to said first junction for maintaining a potential difference across said first and second tunnel diodes to effect current flow therethrough in said predetermined direction, said potential difference being of a magnitude to preclude both said first and second tunnel diodes simultaneously conducting in the switched state; a backward diode and a delay line serially connected from said output junction and a third junction; voltage means connected to said third junction for normally maintaining said second tunnel diode in a switched state, said backward diode being poled to isolate said output junction from said voltage means during periods that said second tunnel diode is in said switched state; and logic means having a plurality of input terminals and an output terminal, said output terminal being connected to said first junction for changing the potential level thereat in response to signals appearing at said input terminals thereby to change the respective states of said first and second tunnel diodes for a period determined by said delay line whereby an output pulse is generated at said output junction.

2. The computer gating device as defined in claim 1 wherein said logic means for changing the potential level at said first junction in response to signals appearing at said input terminals constitutes apparatus for increasing the potential level at said first junction to the extent that the peak voltage across said first tunnel diode is exceeded thereby switching the respectively states of both said first and second tunnel diodes.

3. The compter gating device as defined in claim 1 wherein said logic means for changing the potential level at said first junction in response to signals appearing at said input terminals constitutes apparatus for decreasing the potential level at said first junction to the extent that current flow through said second tunnel diode is less than the valley current thereof thereby switching the respective states of both said first and second tunnel diodes.

4. The computer gating device as defined in claim 1 wherein said logic means for changing the potential level at said first junction in response to signals appearing at said input terminals includes a storage diode having first and second leads therefrom, said first lead being connected to said first junction and means connected to said second lead for causing a constant current that is small compared to the peak current of said second tunnel diode to normally flow in the forward direction therethrough thereby electrically isolating said logic means from said first and second tunnel diodes for a predetermined period of time following a change in the state of the conductive modes thereof.

5. A computer gating device comprising:

(a) first and second tunnel diodes serially connected in the order named from a first junction to an output junction and from said output junction to a second junction, said second junction being maintained at a substantially fixed reference potential level, said first and second tunnel diodes being poled to allow normal current flow from said first to said second junctions and the peak current of said first tunnel diode being greater than the valley current and less than the peak current of said second tunnel diode;

(b) means including a resistor connected to said first junction for maintaining a potential difference across said first and second tunnel diodes to effect current flow therethrough in the normal direction, said potential difference being of a magnitude to preclude both said first and second tunnel diodes simultaneously conducting in the switched state;

(c) a backward diode and a delay line serially connected from said output junction and a third junction;

(d) voltage means connected to said third junction for normally maintaining said second tunnel diode in a switched state, said backward diode being poled to isolate said output junction from said voltage means during periods that said second tunnel diode is in said switched state; and (e) a logic network including a storage diode connected from a fourth junction to said first junction and poled to allow current flow therethrough in a forward direction towards said first junction, a plurality of diodes connected from said fourth junction to a corresponding plurality of input terminals, said plurality of diodes being poled to allow normal current flow therethrough in a direction towards said respective input terminals, and means connected to said fourth junction for normally providing current flow in a forward direction through said storage diode that is small compared to the peak current of said second tunnel diode, whereby the potential level at said first junction is decreased in response to a decrease in potential level at any one of said input terminals thereby changing the respective states of said first and second tunnel diodes for a period determined by said delay line whereby an output pulse is generated at said output junction.

6. A computer gating device comprising:

(a) first and second tunnel diodes serially connected in the order named from a first junction to an output junction and from said output junction to a second junction, said second junction being maintained at a substantially fixed reference potential level, said first and second tunnel diodes being poled to allow normal current flow from said first to said second junctions and the peak current of said first tunnel diode being greater than the valley current and less than the peak current of said second tunnel diode;

(b) means including a resistor connected to said first junction for maintaining a potential difference across said first and second tunnel diodes to effect current flow therethrough in the normal direction, said potential difference being of a magnitude to preclude both said first and second tunnel diodes simultaneously conducting in the switched state;

(c) a backward diode and a delay line serially connected from said output junction and a third junction;

(d) voltage means connected to said third junction for normally maintaining said second tunnel diode in a switched state, said backward diode being poled to isolate said output junction from said voltage means during periods that said second tunnel diode is in said switched state; and (e) a logic network including a storage diode connected from a fourth junction to said first junction and poled to allow current flow therethrough in a forward direction away from said first junction, a plurality of diodes connected from said fourth junction to a corresponding plurality of input terminals, said plurality of diodes being poled to allow normal current flow therethrough in a direction towards said fourth junction, and means connected to said fourth junction for normally providing a current flow in a forward direction through said storage diode that is small compared to the peak current of said second tunnel diode whereby the potential level at said first junction is increased in response to an increase in potential level at any one of said input terminals thereby changing the respective states of said first and second tunnel diodes for a period determined by said delay line whereby an output pulse is generated at said output junction.

No references cited.

ARTHUR GAUSS, *Primary Examiner.*